US00RE45092E

(19) United States
(12) Reissued Patent
Kumakura

(10) Patent Number: US RE45,092 E
(45) Date of Reissued Patent: Aug. 26, 2014

(54) ANISOTROPIC CONDUCTIVE ADHESIVE

(71) Applicant: Dexerials Corporation, Tokyo (JP)

(72) Inventor: Hiroyuki Kumakura, Tochigi (JP)

(73) Assignee: Dexerials Corporation, Tokyo (JP)

(21) Appl. No.: 13/846,051

(22) Filed: Mar. 18, 2013

Related U.S. Patent Documents

Reissue of:
(64) Patent No.: 8,092,636
Issued: Jan. 10, 2012
Appl. No.: 12/678,424
PCT Filed: Sep. 5, 2008
PCT No.: PCT/JP2008/066066
§ 371 (c)(1),
(2), (4) Date: Mar. 16, 2010
PCT Pub. No.: WO2009/054194
PCT Pub. Date: Apr. 30, 2009

(30) Foreign Application Priority Data

Oct. 22, 2007 (JP) ..... 2007-273612

(51) Int. Cl.
*C04B 37/00* (2006.01)
*H01B 1/02* (2006.01)
*H01B 1/22* (2006.01)

(52) U.S. Cl.
USPC ..... 156/325; 252/512; 252/513

(58) Field of Classification Search
USPC ..... 156/325; 252/512, 513
See application file for complete search history.

(56) References Cited

U.S. PATENT DOCUMENTS

| | | | |
|---|---|---|---|
| 5,672,297 | A | 9/1997 | Soane |
| 2002/0070048 | A1 | 6/2002 | Kumakura |
| 2004/0079464 | A1 | 4/2004 | Kumakura |
| 2005/0230667 | A1 | 10/2005 | Komagata et al. |
| 2006/0097230 | A1 | 5/2006 | Hareyama et al. |

FOREIGN PATENT DOCUMENTS

| | | |
|---|---|---|
| JP | A-4-323290 | 11/1992 |
| JP | B2-05-047922 | 7/1993 |
| JP | A-10-130600 | 5/1998 |
| JP | A-10-330718 | 12/1998 |
| JP | A-2001-164207 | 6/2001 |
| JP | A-2001-261974 | 9/2001 |
| JP | A-2002-265920 | 9/2002 |
| JP | A-2002-280715 | 9/2002 |
| JP | A-2006-104273 | 4/2006 |
| JP | A-2006-210621 | 8/2006 |

OTHER PUBLICATIONS

Oct. 30, 2013 Office Action issued in U.S. Appl. No. 13/314,847.
Apr. 18, 2013 Office Action issued in U.S. Appl. No. 13/314,847.
Dec. 21, 2011 Notification of Reasons for Refusal issued in Japanese Application No. 2007-273612 with English-language translation.
May 22, 2012 Office Action issued in Taiwanese Patent Application No. 97134811 (with translation).
Jun. 17, 2010 International Preliminary Report on Patentability issued in corresponding International Patent Application No. PCT/JP2008/066066.
May 25, 2011 Office Action issued in Chinese Application No. 200880113488.1 with English-language translation.
Oct. 14, 2008, International Search Report issued in International Application No. PCT/JP2008/066066 with English-language translation.
Oct. 14, 2010 Office Action issues in U.S. Appl. No. 12/678,424.
Mar. 28, 2011 Office Action issues in U.S. Appl. No. 12/678,424.

*Primary Examiner* — Michael Orlando
(74) *Attorney, Agent, or Firm* — Oliff PLC

(57) ABSTRACT

An anisotropic conductive adhesive for anisotropic conductive connection of an electronic component to a wiring board under no pressure or a low pressure is prepared by dispersing conductive particles in a binder resin composition. A metal flake powder having a major axis of 10 to 40 μm, a thickness of 0.5 to 2 μm, and an aspect ratio of 5 to 50, is used as the conductive particles. The amount of the conductive particles contained in the anisotropic conductive adhesive is 5 to 35 mass %. This anisotropic conductive adhesive is supplied to a connection terminal of a wiring board, and a connection terminal of an electronic component is preliminarily connected to a connection terminal of a substrate while arranging the anisotropic conductive adhesive therebetween. Then, the electronic component is heated without applying a pressure or while applying a low pressure to the electronic component to connect the substrate with the electronic component.

20 Claims, No Drawings

ANISOTROPIC CONDUCTIVE ADHESIVE

Matter enclosed in heavy brackets [ ] appears in the original patent but forms no part of this reissue specification; matter printed in italics indicates the additions made by reissue.

TECHNICAL FIELD

The present invention relates to an anisotropic conductive adhesive for anisotropic conductive connection of an electronic component to a wiring board under no pressure or a low pressure, and to an anisotropic conductive connection method using the same.

BACKGROUND ART

Anisotropic conductive adhesives in which spherical conductive particles are dispersed in a binder resin composition formed from an epoxy resin and a curing agent are widely used when connecting an electronic component, such as a flexible printed circuit film and an IC chip, to a wiring board, such as a rigid board (for example, see Patent Document 1). In this case, the anisotropic conductive adhesive is arranged between the wiring board and the electronic component, and the electronic component is heated by a heat bonder to the curing temperature (for example, 150° C.) of the binder resin or above. Furthermore, to ensure good connection reliability, a pressure of 1 MPa or more is applied. This is performed because, to ensure a sufficiently broad contact surface area, the spherical conducive particles need to be embedded into the connection terminal regions of the wiring board and the electronic component, thus necessitating the application of a comparatively large pressure.

[Patent Document 1] Japanese Examined Patent Publication No. Hei 5-47922

DISCLOSURE OF THE INVENTION

Problems to be Solved by the Invention

However, during anisotropic conductive connection of a flexible printed circuit film and the like to a wiring board, such as a rigid board, since pressure is ultimately applied on the wiring board also, the wiring board can become damaged. In particular, to realize high-density packaging, if an electronic component is also mounted on a back face of the wiring board, not only the wiring board, but the electronic component on the back face and the wire connecting the component can also be damaged.

It is an object of the present invention to solve such problems in the conventional art, by providing an anisotropic conductive adhesive capable of anisotropic conductive connection of an electronic component to a wiring board under no pressure or a low pressure.

Means for Solving the Problems

The present inventor discovered that the above object can be achieved by using a metal flake powder, which has a specific size, thickness, and aspect ratio, as the conductive particles used in an anisotropic conductive adhesive, thereby completing the present invention.

Specifically, the present invention provides an anisotropic conductive adhesive for anisotropic conductive connection of an electronic component to a wiring board under no pressure or a low pressure, wherein conductive particles are dispersed in a binder resin composition. This anisotropic conductive adhesive is characterized in that the conductive particles include a metal flake powder having a major axis of 10 to 40 μm, a thickness of 0.5 to 2 μm, and an aspect ratio of 5 to 50, and that an amount of the conductive particles contained in the anisotropic conductive adhesive is 5 to 35 mass %.

Furthermore, the present invention provides an anisotropic conductive connection method comprising: supplying the above-described anisotropic conductive adhesive to a connection terminal of a wiring board; preliminarily connecting a connection terminal of an electronic component to a connection terminal of a substrate while arranging the anisotropic conductive adhesive therebetween; and heating the electronic component without applying a pressure or while applying a low pressure to the electronic component to connect the substrate with the electronic component.

Advantages of the Invention

The anisotropic conductive adhesive according to the present invention uses a metal flake powder, which has a specific size, thickness, and aspect ratio, as conductive particles. The fact that the conductive particles include a metal flake powder with such a shape and dimensions enables surface contact between connection terminals and the conductive particles without having to embed the metal flake powder into the respective connection terminals of the wiring board and the electronic component. Therefore, anisotropic conductive connection which exhibits good connection reliability can be realized by positioning the connection terminal of the wiring board and the connection terminal of the electronic component while arranging the anisotropic conductive adhesive therebetween, preliminarily connecting them at a comparatively low pressure, and then heating under conditions of no applied pressure (i.e., without applying a pressure) or of an applied pressure which is comparatively low compared with the conventional art.

BEST MODE FOR CARRYING OUT THE INVENTION

The present invention is an anisotropic conductive adhesive for anisotropic conductive connection of an electronic component to a wiring board under no pressure or a low pressure, wherein conductive particles are dispersed in a binder resin composition. A characteristic of the present invention is that a metal flake powder having a major axis of 10 to 40 μm, a thickness of 0.5 to 2 μm, and an aspect ratio of 5 to 50, is used as the conductive particles.

A powder of flakes of a metal such as nickel, silver and the like can be used as the metal flake powder. However, among these, it is preferred to use a nickel flake powder, from the perspective of low-cost and good conductivity.

The metal flake powder used in the present invention has a major axis of 10 to 40 μm, and preferably 10 to 30 μm, and a thickness of 0.5 to 2 μm, and preferably 0.5 to 1.5 μm. Regarding the major axis, the reason for the above range is that conduction resistance after connection tends to increase if the major axis is less than 10 μm, and insulation resistance tends to decrease if the major axis is more than 40 μm. Furthermore, regarding the thickness, the reason for the above range is that insulation resistance tends to decrease if the thickness is less than 0.5 μm, and conduction resistance after connection tends to increase if the thickness is more than 2 μm. The major axis and the thickness of the metal flake powder are values measured by external observation with an electron microscope or the like. Further, the minor axis of the metal flake powder is usually a length about 10 to 50% that of the major axis.

In addition, the metal flake powder used in the present invention has an aspect ratio (i.e., value obtained by dividing the major axis by the thickness) of 5 to 50, and preferably 5 to 42. The reason for this is that conduction resistance after connection tends to increase if the aspect ratio is less than 5, and insulation resistance tends to decrease if the aspect ratio is more than 50.

In the present invention, the amount of the conductive particles contained in the anisotropic conductive adhesive is 5 to 35 mass %, and preferably 7 to 30 mass %. The reason for this is that connection reliability is insufficient if the amount is less than 5 mass %, and if the amount is more than 35 mass %, anisotropic properties can be lost and connection strength may decrease.

The binder resin composition forming the anisotropic conductive adhesive according to the present invention may be appropriately selected from among thermosetting binder resin compositions which have conventionally been used in anisotropic conductive adhesives. Examples thereof include a binder resin composition which blends a curing agent, such as an imidazole curing agent and an amine curing agent, in a thermosetting epoxy resin, thermosetting urea resin, thermosetting melamine resin, thermosetting phenol resin or the like. Among these, if adhesive strength after curing is considered as a beneficial point, a binder resin composition using a thermosetting epoxy resin as the binder resin can be preferably used.

Such thermosetting epoxy resins may be in a liquid or a solid state, and preferably have an epoxy equivalent of usually about 100 to 4,000, and two or more epoxy groups in the molecule. Examples thereof which can be preferably used include bisphenol A-type epoxy compounds, phenol novolac-type epoxy compounds, cresol novolac-type epoxy compounds, ester-type epoxy compounds, and alicyclic epoxy compounds. In addition, monomers and oligomers are included in these compounds.

The binder resin composition of the present invention may include a filling agent such as silica and mica, a pigment, an antistatic agent and the like, if required. A coloring agent, a preservative, a polyisocyanate crosslinking agent, a silane coupling agent and the like may also be added.

Furthermore, known spherical conductive particles may also be added. Adding spherical conductive particles in addition to the metal flake powder has the advantage that conduction resistance can be better stabilized, and the advantage that the production costs of the anisotropic conductive adhesive can be suppressed by reducing the used amount of the metal flake powder. It is preferred that these spherical conductive particles have an average particle size of 1 to 10 μm, and are smaller than the major axis of the conductive particles. The added amount of the spherical conductive particles is preferably 0.1 to 1 times (parts by mass) the added amount of the metal flake powder.

If the viscosity of the anisotropic conductive adhesive according to the present invention is too low, the anisotropic conductive adhesive flows during the mail curing process after the preliminary pressure-bonding. Consequently, connection defects tend to occur. If the viscosity of the anisotropic conductive adhesive is too high, defects tend to occur during coating. Therefore, the viscosity at 25° C. measured by a cone-plate viscometer is preferably 50 to 200 Pa·s, and more preferably 50 to 150 Pa·s.

The anisotropic conductive adhesive according to the present invention can be produced by uniformly dispersing the metal flake powder, which acts as conductive particles, in a thermosetting binder resin composition by an ordinary method.

As described below, the anisotropic conductive adhesive according to the present invention can be preferably used during anisotropic conductive connection of a wiring board and an electronic component.

First, the anisotropic conductive adhesive is supplied onto a connection terminal of a wiring board. Examples of this wiring board include a glass wiring board having a transparent electrode formed thereon, a glass epoxy wiring board, a polyimide printed circuit film board and the like. As the connection terminal, terminals suited to each board may be used.

Further, although a common method of supplying from a syringe is generally used, some other method may also be used as the method for supplying the anisotropic conductive adhesive. The anisotropic conductive adhesive may be formed into a film, and supplied as an anisotropic conductive adhesive film. The thickness of the supplied anisotropic conductive adhesive is usually 30 to 50 μm.

Next, the connection terminal of the electronic component is preliminarily connected to the connection terminal of the wiring board while arranging the anisotropic conductive adhesive therebetween. More specifically, the connection terminal of the electronic component is positioned on the connection terminal of the wiring board while arranging the anisotropic conductive adhesive therebetween. Then, a pressure of preferably 0.1 to 1 MPa is applied on the electronic component for preliminarily connection. In this case, heating may be carried out to the extent that the binder resin composition is not completely cured. Examples of the electronic component include an IC chip, a flexible printed circuit film and the like.

Next, heating is carried out without applying a pressure to the electronic component, or while applying a low pressure (i.e., 1 MPa or less) on the electronic component, to almost completely, or even completely, cure the binder resin composition. Consequently, anisotropic conductive connection which is stable and exhibits good connection reliability can be realized.

The anisotropic conductive adhesive according to the present invention can be used not only for the above-described anisotropic conductive connection application, but also preferably used for conductive connection which does not require anisotropic properties. Examples thereof include connection of electronic parts such as a resistor, a capacitor, a piezo element and the like.

EXAMPLES

The present invention will now be described in more detail based on the following examples.

Examples 1 to 7 and Comparative Examples 1 to 9

The components of Table 1 were uniformly mixed by a mixer to prepare an anisotropic conductive adhesive. The viscosity of the obtained anisotropic conductive adhesive was measured at a temperature of 25° C. and at a shear rate of 10 (l/s) using a rheometer (cone-plate viscometer, manufactured by Haake). The obtained results are shown in Table 1. Furthermore, the size of the used nickel flakes and the spherical nickel particles was directly observed with an electron microscope. These results are shown in Table 1.

(Anisotropic Conductive Connection Evaluation)

The obtained anisotropic conductive adhesive was coated from a syringe to a thickness of 35 μm on a connection terminal part of a rigid printed wiring board (glass epoxy substrate 1.1 mm thick/Cu wire 35 μm thick/surface gold plating: 2 mm pitch, L/S=1/1). From above this anisotropic conductive adhesive, a connection terminal of a flexible wiring circuit film (polyimide film substrate 22 μm thick/Cu wire 18 μm thick/surface gold plating: 2 mm pitch, L/S=1/1) was positioned on the connection terminal of the rigid printed wiring board, and the connection terminals were preliminarily connected by applying a pressure of 0.5 MPa at room temperature.

The preliminarily-connected structure was placed in an oven heated to 120° C., and then heated for 10 minutes without applying a pressure to the connection parts. This caused the binder resin composition to cure, thereby realizing anisotropic conductive connection. As described below, the obtained connected structure was tested and evaluated concerning conduction resistance, insulation resistance, and peel strength.

<Conduction Resistance>

The conduction resistance (Max., Min., and Ave.) of the connected structure obtained by anisotropic conductive connection was measured by a four-terminal method using a digital multimeter (Advantest). The obtained results are shown in Table 1. In practice, a maximum value of 10Ω or less, a minimum value of 0.5Ω or less, and an average value of 1 to 5Ω, are desirable.

<Insulation Resistance>

The insulation resistance between adjacent terminals of the connected structure obtained by anisotropic conductive connection was measured under an applied voltage of 20 V. An insulation resistance of $10^8$Ω or more was evaluated as "A", of $10^7$ to $10^8$Ω was evaluated as "B", and of $10^7$Ω or less was evaluated as "C". In practice, an evaluation of A or B is desirable.

<Peel Strength>

With the rigid printed wiring board of the connected structure obtained by anisotropic conductive connection fixed, the flexible wiring circuit film was peeled off in a 90° direction at a rate 50 mm/min. The peel strength at this stage was measured using a tensile testing machine. The obtained results are shown in Table 1. In practice, a value of 5 N/cm or more is desirable.

TABLE 1

| | | Comp. Ex. 1 | Ex. 1 | Ex. 2 | Ex. 3 | Ex. 4 | Ex. 5 | Comp. Ex. 2 | Comp. Ex. 3 | Comp. Ex. 4 |
|---|---|---|---|---|---|---|---|---|---|---|
| jER828*1 | (parts by mass) | 30 | 30 | 30 | 30 | 30 | 30 | 30 | 30 | 30 |
| jER154*2 | (parts by mass) | 10 | 10 | 10 | 10 | 10 | 10 | 10 | 10 | 10 |
| HX3748*3 | (parts by mass) | 50 | 50 | 50 | 50 | 50 | 50 | 50 | 50 | 50 |
| KBM403*4 | (parts by mass) | 1 | 1 | 1 | 1 | 1 | 1 | 1 | 1 | 1 |
| Ni flake A*5 | (parts by mass) | | | | | | | | | |
| Ni flake B*6 | (parts by mass) | | | | | | | | | |
| Ni flake C*7 | (parts by mass) | 4 | 8 | 20 | 30 | 40 | 50 | 60 | 70 | 80 |
| Ni flake D*8 | (parts by mass) | | | | | | | | | |
| Ni flake E*9 | (parts by mass) | | | | | | | | | |
| Spherical Ni Particle*10 | (parts by mass) | | | | | | | | | |
| Ni | mass % | 3.8 | 7.4 | 16.7 | 23.1 | 28.6 | 33.3 | 37.5 | 41.2 | 44.4 |
| Ni | Volume % | 0.54 | 1.07 | 2.63 | 3.89 | 5.12 | 7.48 | 8.62 | 9.74 | 10.82 |
| (Evaluation) | | | | | | | | | | |
| Viscosity | Pa · s | 31 | 38 | 55 | 85 | 130 | 190 | 210 | 270 | 320 |
| Conduction Resistance | Max. Ω | 1K< | 9.50 | 8.17 | 8.08 | 5.72 | 5.84 | 8.06 | 10.26 | 8.89 |
| | Min. Ω | 0.48 | 0.40 | 0.32 | 0.27 | 0.29 | 0.19 | 0.19 | 0.34 | 0.50 |
| | Ave. Ω | — | 4.52 | 4.24 | 2.23 | 3.42 | 2.63 | 2.21 | 3.13 | 2.86 |
| Insulation Resistance | | A | A | A | A | A | B | C | C | C |
| Peel Strength | N/cm | 85 | 8.6 | 9.1 | 8.7 | 9.4 | 9.2 | 5.4 | 5.5 | 5.1 |

| | | Comp. Ex. 5 | Comp. Ex. 6 | Comp. Ex. 7 | Ex. 6 | Ex. 7 | Comp. Ex. 8 | Comp. Ex. 9 |
|---|---|---|---|---|---|---|---|---|
| jER828*1 | (parts by mass) | 30 | 30 | 30 | 30 | 30 | 30 | 30 |
| jER154*2 | (parts by mass) | 10 | 10 | 10 | 10 | 10 | 10 | 10 |
| HX3748*3 | (parts by mass) | 50 | 50 | 50 | 50 | 50 | 50 | 50 |
| KBM403*4 | (parts by mass) | 1 | 1 | 1 | 1 | 1 | 1 | 1 |
| Ni flake A*5 | (parts by mass) | | | 40 | | | | |
| Ni flake B*6 | (parts by mass) | | | | 40 | | | |
| Ni flake C*7 | (parts by mass) | 90 | 100 | | | | | |
| Ni flake D*8 | (parts by mass) | | | | | 40 | | |
| Ni flake E*9 | (parts by mass) | | | | | | 40 | |
| Spherical Ni Particle*10 | (parts by mass) | | | | | | | 40 |
| Ni | mass % | 47.4 | 50 | 28.6 | 28.6 | 28.6 | 28.6 | 28.6 |
| Ni | Volume % | 11.88 | 5.12 | 5.12 | 5.12 | 5.12 | 5.12 | 5.12 |
| (Evaluation) | | | | | | | | |
| Viscosity | Pa · s | 400 | 550 | 115 | 120 | 131 | 160 | 74 |
| Conduction Resistance | Max. Ω | 11.62 | 24.91 | 1K< | 7.65 | 6.81 | 4.37 | 51.19 |
| | Min. Ω | 0.43 | 0.51 | 3.52 | 0.36 | 0.21 | 0.48 | 2.61 |
| | Ave. Ω | 2.73 | 7.63 | — | 3.53 | 2.86 | 3.41 | 11.85 |
| Insulation Resistance | | C | C | A | A | A | C | A |
| Peel Strength | N/cm | 4.7 | 4.2 | 6.8 | 9 | 9.1 | 9.3 | 6.5 |

Note in Table 1:

*1BPA-type epoxy resin, manufactured by Japan Epoxy Resins Co., Ltd.

*2Phenol novolac-type epoxy resin, manufactured by Japan Epoxy Resins Co., Ltd.

*3Master batch-type latent curing agent (curing agent component/BPA-type epoxy resin = 35/65, Asahi Kasei Chemicals Corporation

*4Epoxy silane coupling agent, Shin-Etsu Chemical Co., Ltd.

*5Major axis: 5 μm, Thickness: 2.2 μm, Aspect Ratio: 2.3

TABLE 1-continued

*[6]Major axis: 10 μm, Thickness: 1.5 μm, Aspect Ratio: 6.7
*[7]Major axis: 20 μm, Thickness: 1 μm, Aspect Ratio: 20
*[8]Major axis: 30 μm, Thickness: 0.7 μm, Aspect Ratio: 42.9
*[9]Major axis: 50 μm, Thickness: 0.4 μm, Aspect Ratio: 125
*[10]Particle size: 10 μm From Table 1, it can be seen that the anisotropic conductive adhesive according to the present invention, which used a metal flake powder having a specific size and aspect ratio as conductive particles, exhibited a conduction resistance, an insulation resistance, and a peel strength which would not be a problem in actual practice. On the other hand, the anisotropic conductive adhesive of Comparative Example 1 had a nickel flake amount of less than 5 mass %, and thus was not suited to practical use as its conduction resistance (max) was too high. The anisotropic conductive adhesives of Comparative Examples 2 to 6 had a nickel flake amount which exceeded 35 mass %, and thus were not suited to practical use as they could not maintain insulation resistance between adjacent terminals. For the anisotropic conductive adhesive of Comparative Example 7, the aspect ratio of the used metal flakes was less than 5. Thus, the anisotropic conductive adhesive of Comparative Example 7 was not suited to practical use as its conduction resistance (max) was too high. Furthermore, for the anisotropic conductive adhesive of Comparative Example 8, the aspect ratio of the used metal flakes exceeded 50. Thus, the anisotropic conductive adhesive of Comparative Example 8 was not suited to practical use as it could not maintain insulation resistance between adjacent terminals. For the anisotropic conductive adhesive of Comparative Example 9, because spherical conductive particles were used instead of metal flakes, the conduction resistance (max) was high. Thus, the anisotropic conductive adhesive of Comparative Example 9 was not suited to practical use.

Example 8 and Comparative Example 10

Using the anisotropic conductive adhesive of Example 4 or Comparative Example 9, during anisotropic conductive connection after preliminary connection, the anisotropic conductive connection was performed by connecting the flexible printed circuit film at the connection pressure shown in below Table 2 for 10 seconds at 180° C. using a constant heat bonder (2 mm wide). The obtained connected structure was tested and evaluated in the same manner as in Example 1 concerning conduction resistance and insulation resistance.

The obtained results are shown in Table 2.

TABLE 2

| Adhesive | | Example 8 ACP of Example 4 from Table 1 | | | | Comparative Example 10 ACP of Comparative Example 9 from Table 1 | | | |
|---|---|---|---|---|---|---|---|---|---|
| Connection Pressure | | 1 MPa | 0.5 MPa | 0.2 MPa | 0.1 MPa | 1 MPa | 0.5 MPa | 0.2 MPa | 0.1 MPa |
| Conduction Resistance | Max. Ω | 0.75 | 1.05 | 1.56 | 2.17 | 0.87 | 3.9 | 9.7 | 23.55 |
| | Min. Ω | 0.27 | 0.29 | 0.31 | 0.33 | 0.35 | 0.63 | 1.34 | 2.08 |
| | Ave. Ω | 0.52 | 0.56 | 0.73 | 0.82 | 0.74 | 1.11 | 2.95 | 4.63 |
| Insulation Resistance | | A | A | A | A | A | A | A | A |

It can be seen from Table 2 that the anisotropic conductive adhesive according to the present invention can ensure good connection reliability even without applying a pressure to a connection part, or by applying a pressure of 1 MPa or less on the connection part, and especially under low pressure conditions of 0.5 MPa or less. In contrast, in Comparative Example 10, which used spherical conductive particles, conduction resistance was higher than in Example 8, and it was difficult to ensure good connection reliability under low pressure conditions.

INDUSTRIAL APPLICABILITY

The anisotropic conductive adhesive according to the present invention uses a metal flake powder, which has a specific size, thickness, and aspect ratio, as conductive particles. Therefore, anisotropic conductive connection which exhibits good connection reliability can be realized by positioning a connection terminal of a wiring board and a connection terminal of an electronic component with the anisotropic conductive adhesive arranged therebetween, preliminarily connecting them at a comparatively low pressure, and then heating them under conditions of no applied pressure or an applied pressure which is comparatively low compared with the conventional art. Thus, the anisotropic conductive adhesive according to the present invention is useful in anisotropic conductive connection to a connection part under conditions of no applied pressure to a low applied pressure.

The invention claimed is:

1. An anisotropic conductive connection method comprising:

supplying an anisotropic conductive adhesive to a connection terminal of a wiring board;

preliminarily connecting a connection terminal of an electronic component to the connection terminal of the wiring board while arranging the anisotropic conductive adhesive therebetween; and heating the electronic component while applying a pressure of 1 MPa or less to the electronic component to connect the wiring board with the electronic component and to completely or almost completely cure the adhesive;

wherein the adhesive comprises:

a binder resin composition and conductive particles that include a metal flake powder and are dispersed in the binder resin composition, wherein:

the metal flake powder enables electrical connection between the connection terminals and the conductive particles due to surface connection;

the metal flake powder has a major axis of 10 to 40 μm, a thickness of 0.5 to 2 μm, and an aspect ratio of 5 to 50; and an amount of the conductive particles contained in the anisotropic conductive adhesive is 5 to 35 mass %.

2. The anisotropic conductive connection method according to claim 1, wherein the metal flake powder is a nickel flake powder.

3. The anisotropic conductive connection method according to claim 1, wherein the binder resin composition comprises an epoxy resin and an imidazole curing agent.

4. The anisotropic conductive connection method according to claim 1, wherein the adhesive has a viscosity of 50 to 200 Pa·s at 25° C.

5. The anisotropic conductive connection method according to claim 1, wherein a pressure of 0.1 to 1 MPa is applied to the electronic component during the preliminary connecting.

6. The anisotropic conductive connection method according to claim 1, wherein the electronic component is heated without applying a pressure.

7. The anisotropic conductive connection method according to claim 2, wherein the binder resin composition comprises an epoxy resin and an imidazole curing agent.

8. The anisotropic conductive connection method according to claim 2, wherein the adhesive has a viscosity of 50 to 200 Pa·s at 25° C.

9. The anisotropic conductive connection method according to claim 3, wherein the adhesive has a viscosity of 50 to 200 Pa·s at 25° C.

10. The anisotropic conductive connection method according to claim 7, wherein the adhesive has a viscosity of 50 to 200 Pa·s at 25° C.

*11. The anisotropic conductive connection method according to claim 1, wherein the metal flake powder has a major axis of 10 to 30 μm.*

*12. The anisotropic conductive connection method according to claim 1, wherein the metal flake powder has a thickness of 0.5 to 1.5 μm.*

*13. The anisotropic conductive connection method according to claim 1, wherein the metal flake powder has a minor axis of 10% to 50% of a length of the major axis.*

*14. The anisotropic conductive connection method according to claim 1, wherein the metal flake powder has an aspect ratio of 5 to 42.*

*15. The anisotropic conductive connection method according to claim 1, wherein the conductive particles are 7 to 30 mass % of the adhesive.*

*16. The anisotropic conductive connection method according to claim 1, wherein the conductive particles further include spherical conductive particles.*

*17. The anisotropic conductive connection method according to claim 1, wherein the adhesive has a viscosity of 50 to 150 Pa·s at 25° C.*

*18. The anisotropic conductive connection method according to claim 1, wherein the adhesive is supplied to the connection terminal as a film.*

*19. The anisotropic conductive connection method according to claim 18, wherein the film has a thickness of 30 to 50 μm.*

*20. The anisotropic conductive connection method according to claim 1, wherein a pressure of 0.5 MPa or less is applied to the electronic component during heating.*

* * * * *